(12) United States Patent
Yang et al.

(10) Patent No.: US 10,480,057 B2
(45) Date of Patent: Nov. 19, 2019

(54) APPARATUS AND A METHOD FOR PLATING AN ND—FE—B MAGNET

(71) Applicant: Yantai Shougang Magnetic Materials Inc., Yantai (CN)

(72) Inventors: Kunkun Yang, Yantai (CN); Zhongjie Peng, Yantai (CN)

(73) Assignee: YANTAI SHOUGANG MAGNETIC MATERIALS INC., Yantai (CN)

( * ) Notice: Subject to any disclaimer, the term of this patent is extended or adjusted under 35 U.S.C. 154(b) by 472 days.

(21) Appl. No.: 15/041,083

(22) Filed: Feb. 11, 2016

(65) Prior Publication Data

US 2016/0230267 A1    Aug. 11, 2016

(30) Foreign Application Priority Data

Feb. 11, 2015   (CN) .......................... 2015 1 0070271

(51) Int. Cl.
*H01J 49/12* (2006.01)
*H01J 37/34* (2006.01)
(Continued)

(52) U.S. Cl.
CPC ............ *C23C 14/165* (2013.01); *C23C 14/24* (2013.01); *C23C 14/3414* (2013.01); *C23C 14/35* (2013.01); *H01J 37/32018* (2013.01); *H01J 37/32027* (2013.01); *H01J 37/32055* (2013.01); *H01J 37/32449* (2013.01);
(Continued)

(58) Field of Classification Search
CPC . H01F 1/057; H01J 37/32449; H01J 37/3405; H01J 37/3435; H01J 37/32018; H01J 37/32027; H01J 37/34; H01J 49/12; H01J 37/32055; C23C 14/3414; C23C 14/35; C23C 14/165; C23C 14/24
See application file for complete search history.

(56) References Cited

U.S. PATENT DOCUMENTS 6,348,138 B1   2/2002   Yoshimura et al.
6,355,313 B1   3/2002   Yoshimura et al.
(Continued)

FOREIGN PATENT DOCUMENTS

CN   100582290 C   7/2008
KR   1007012687 B1   3/2007

*Primary Examiner* — Michael A Band
(74) *Attorney, Agent, or Firm* — William H. Honaker; Dickinson Wright PLLC

(57) ABSTRACT

An apparatus for plating Nd—Fe—B magnet includes a cathode and a target source holder defining a predetermined distance of 5 mm to 200 mm therebetween. A pulse bias power supply having a first positive terminal connected to an anode and a first negative terminal connected to the cathode. A DC bias power supply having a second positive terminal connected to the anode and a second negative terminal connected to the target source holder. The anode is connected to the earth ground. A method for plating the Nd—Fe—B magnet includes steps of maintaining the predetermined distance of 5 mm to 200 mm between the cleaned Nd—Fe—B magnet and the target source material, increasing a first electric potential to the cathode and a second electric potential to the target source holder with the second electric potential greater than the first electric potential, and maintaining a potential differential of 0V to 500V therebetween.

7 Claims, 2 Drawing Sheets

(51) Int. Cl.
*H01J 37/32* (2006.01)
*C23C 14/35* (2006.01)
*C23C 14/34* (2006.01)
*C23C 14/24* (2006.01)
*C23C 14/16* (2006.01)

(52) U.S. Cl.
CPC .......... *H01J 37/34* (2013.01); *H01J 37/3405* (2013.01); *H01J 37/3435* (2013.01); *H01J 49/12* (2013.01)

(56) References Cited

U.S. PATENT DOCUMENTS

| | | |
|---|---|---|
| 6,391,386 B1 | 5/2002 | Nishiuchi et al. |
| 6,617,044 B2 | 9/2003 | Nishiuchi et al. |
| 6,861,089 B2 | 3/2005 | Nishiuchi et al. |
| 6,866,765 B2 | 3/2005 | Ando et al. |
| 6,872,260 B2 | 3/2005 | Nishiuchi et al. |
| 6,878,210 B2 | 4/2005 | Tochishita et al. |
| 6,923,898 B2 | 8/2005 | Yoshimura et al. |
| 6,960,368 B2 | 11/2005 | Nishiuchi et al. |
| 7,056,192 B2 | 6/2006 | Nishiuchi et al. |
| 7,086,934 B2 | 8/2006 | Tochishita et al. |
| 7,270,714 B2 | 9/2007 | Nishiuchi et al. |
| 7,402,226 B2 | 7/2008 | Machida et al. |
| 8,163,106 B2 | 4/2012 | Kikugawa et al. |
| 2006/0278517 A1* | 12/2006 | Machida ............ C23C 14/3464 204/192.1 |
| 2014/0291148 A1* | 10/2014 | Ishimura ............ H01J 37/3405 204/298.16 |

* cited by examiner

APPARATUS AND A METHOD FOR PLATING AN ND—FE—B MAGNET

CROSS REFERENCE TO RELATED APPLICATION

This application claims the benefit of a Chinese application having a serial number of 201510070271.9, published as CN 104651779 A, and filed on Feb. 11, 2015.

BACKGROUND OF THE INVENTION

1. Field of the Invention

The present invention generally relates to an apparatus and a method for plating an Nd—Fe—B magnet.

2. Description of the Prior Art

New Nd—Fe—B magnets are considered as third generation rare-earth material since 1983. The Nd—Fe—B magnets are materials that have magnetic properties and include a main phase of $Nd_2Fe_{14}B$ and a grain boundary phase of rich neodymium. The Nd—Fe—B magnets also have a poor resistance to corrosion. In addition, the magnetic properties of the Nd—Fe—B magnets can be easily affected by temperature fluctuation. Vacuum evaporation plating method can be used to deposit an anti-corrosion film of metal and/or other functional films on the surface of the Nd—Fe—B magnets. The vacuum evaporation plating method is safe, clean, and provides little damages to the Nd—Fe—B magnets.

Currently methods such as multi-arc ion plating, magnetron sputtering, and multi-arc magnetron sputtering are used to deposit the anti-corrosion film and/or other functional films on the surface of the Nd—Fe—B magnets. However, the methods place large limitations on the target source material because the target source material should be a non-magnetic material. In addition, the methods also have a low the target source material utilization rate which can be very costly when used to plate precious metals.

A metal film can be deposited on the surface of the Nd—Fe—B magnet using the vacuum evaporation plating method. During the vacuum evaporation plating, the utilization rate of the target source material is higher than multi-arc ion plating, magnetron sputtering, and multi-arc magnetron sputtering. However, for target source materials that have high melting points, high temperatures in the vacuum chamber during the vacuum evaporation plating can cause the magnetic materials in the Nd—Fe—B magnets to deteriorate thereby reduces the magnetic properties for the Nd—Fe—B magnets.

Such an apparatus is disclosed in Published Korean Patent Application KR100701267 B1 which discloses a pulse arc generating apparatus. The apparatus includes a furnace defining a vacuum chamber. An anode being elongated is disposed in the vacuum chamber of the furnace. A cathode being elongated is disposed in the vacuum chamber of the furnace and spaced from the anode for plating an Nd—Fe—B magnet. At least one target source holder is disposed in the vacuum chamber, supporting the anode and the cathode in parallel and spaced relationship to one another, and between and spaced apart from the cathode and the anode for receiving a target source material to coat the Nd—Fe—B magnet. A power source is electrically connected to the cathode and the anode for cleaning and vaporizing the target source material and to plate the target source material onto the Nd—Fe—B magnet.

Such a method is disclosed in Published Chinese Patent CN 100582290C. The method includes a step of removing grease from an Nd—Fe—B magnet to produce a purified Nd—Fe—B magnet. The next step of the method is disposing a target source material of metal on at least one target source holder and disposing the purified Nd—Fe—B magnet on a cathode in a vacuum chamber of a furnace opposite of the least one target source holder. After disposing the target source material on the at least one target source holder and the purified Nd—Fe—B magnet on the cathode, the target source material of metal is deposited on the purified Nd—Fe—B magnet to produce a coated Nd—Fe—B magnet.

SUMMARY OF THE INVENTION

The invention provides for such an apparatus wherein the cathode and the target source holder defines a predetermined distance between 5 mm and 200 mm between the cathode and the target source holder to increase efficiency of depositing the target source material on the Nd—Fe—B magnet and provide a uniform coating on the Nd—Fe—B magnet.

The invention provides for such a method wherein the step of disposing the purified Nd—Fe—B magnet further including a step of maintaining a predetermined distance of between 5 mm and 200 mm between an opposing surface of the purified Nd—Fe—B magnet on the cathode and the target source material on the at least one target source holder to increase efficiency of the step of depositing the target source material of metal on the purified Nd—Fe—B magnet.

ADVANTAGES OF THE INVENTION

The present invention overcomes the shortages of the existing technologies, and provides a method of depositing aluminum on a permanent Nd—Fe—B magnet.

The present invention provides for an Nd—Fe—B permanent magnet including a metal film having a uniform thickness. The present invention also provides an apparatus for plating the Nd—Fe—B magnet having a simple structure and a lower target source material limitation.

The present invention provides for a method for plating the Nd—Fe—B magnet performed at a lower temperature thereby reduces damages done to the Nd—Fe—B magnet during the plating process. The present invention further provides for a method for plating the Nd—Fe—B magnet that can be easily controller and environmentally friendly.

BRIEF DESCRIPTION OF THE DRAWINGS

Other advantages of the present invention will be readily appreciated, as the same becomes better understood by reference to the following detailed description when considered in connection with the accompanying drawings wherein.

DESCRIPTION OF THE ENABLING EMBODIMENT

Figure 1:
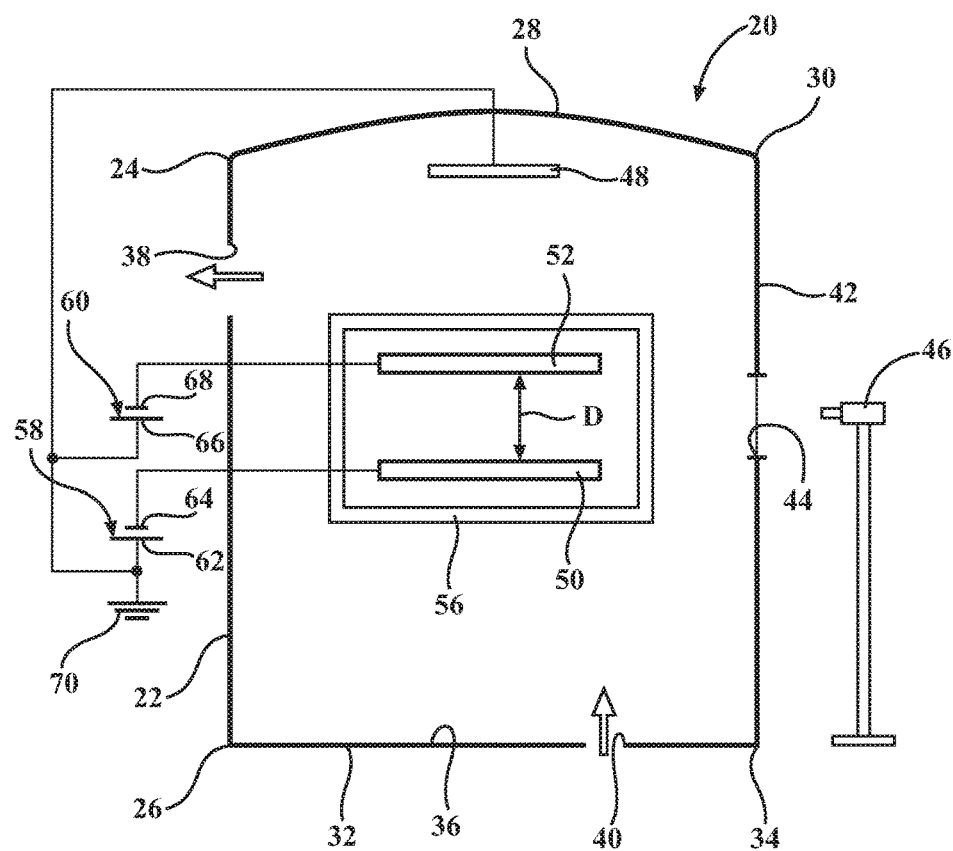
FIG. 1 is a cross-sectional schematic view of the apparatus for plating an Nd—Fe—B magnet.

Referring to the Figures, wherein like numerals indicate corresponding parts throughout the several views, it is one aspect of the present invention to provide an apparatus for plating an Nd—Fe—B magnet which is generally shown in FIG. 1.

The apparatus includes a furnace 20 having a rectangular shape in cross-section. The furnace 20 includes a rear wall 22 having a rectangular shape in cross-section and extends between a first end 24 and a second end 26. The furnace 20 also includes a top wall 28 of arcuate shape and having a rectangular shape in cross-section. The top wall 28 is disposed on the first end 24 of the rear wall 22 and extends outwardly from the first end 24 of the rear wall 22 to a top end 30. The furnace 20 further includes a bottom wall 32 having a rectangular shape in cross-section. The bottom wall 32 is disposed on the second end 26 of the rear wall 22, spaced from the top wall 28, and extends perpendicularly outwardly from the second end 26 of the rear wall 22 to a bottom end 34 to define a U-shape and a vacuum chamber 36 extending between the top wall 28, the bottom wall 32, and the rear wall 22. It should be appreciated that the furnace 20 may be of any shape in cross-section, such as, but not limited to circular shape.

The rear wall 22 of the furnace 20 defines an outlet aperture 38 having a circular shape. The outlet aperture 38 is disposed adjacent to the top wall 28 of the furnace 20, spaced from the first end 24, and in fluid communication with the vacuum chamber 36 for withdrawing air from the vacuum chamber 36 to reduce pressure in the vacuum chamber 36. It should be appreciated that the outlet aperture 38 can be disposed anywhere on the rear wall 22 of the furnace 20 in fluid communication with the vacuum chamber 36. The bottom wall 32 of the furnace 20 defines an inlet aperture 40 having a circular shape. The inlet aperture 40 is disposed adjacent and spaced from the bottom end 34 of the bottom wall 32 and in fluid communication with the vacuum chamber 36 for feeding an inert gas of argon to the vacuum chamber 36 to provide an inert environment in the vacuum chamber 36 and increase pressure in the vacuum chamber 36. It should be appreciated that the inlet aperture 40 can be disposed anywhere on the rear wall 22 of the furnace 20 in fluid communication with the vacuum chamber 36.

A door 42 having a rectangular shape in cross-section is disposed adjacent to the top end 30 of the top wall 28 and the bottom end 34 of the bottom wall 32 and removably affixed, using bolts or adhesives, to the top end 30 of the top wall 28 and the bottom end 34 of the bottom wall 32 for closing and sealing the vacuum chamber 36. The door 42 defining an observation window 44 of glass for allowing a user to look into the vacuum chamber 36. An optical pyrometer 46 is disposed adjacent to the observation window 44 of the door 42 and facing toward the observation window 44 and the vacuum chamber 36 for monitoring the temperature in the vacuum chamber 36.

An anode 48 being elongated and having a rectangular shape in cross-section is disposed in the vacuum chamber 36 and affixed to the furnace 20 for plating the Nd—Fe—B magnet. A cathode 50 being elongated and having a rectangular shape in cross-section disposed in the vacuum chamber 36 and affixed to the furnace 20 and spaced apart from the anode 48 for plating the Nd—Fe—B magnet. At least one target source holder 52, 54 of rectangular shape in cross-section is disposed in the vacuum chamber 36 and supporting the anode 48 and the cathode 50 in parallel and spaced relationship to one another and between and spaced apart from the cathode 50 and the anode 48 for receiving a target source material to coat the Nd—Fe—B magnet. The target source material may be selected from at least one of Dysprosium, Terbium, Holmium, Praseodymium, Neodymium, Niobium, Molybdenum, Copper, Titanium, Aluminum, and Cobalt.

A thermal insulator 56 of rectangular shape in cross-section is disposed in the vacuum chamber 36. The thermal insulator 56 extends about the cathode 50 and the at least one target source holder 52, 54 to enclose the cathode 50 and the at least one target source holder 52, 54 in the thermal insulator 56 to maintain a constant temperature between the cathode 50 and the at least one target source holder 52, 54. A power source 58, 60 is electrically connected to the anode 48, the cathode 50, and the at least one target source for providing power to the anode 48, the cathode 50, and the at least one target source to clean and vaporized the target source material and deposit the target source material onto the Nd—Fe—B magnet.

The cathode 50 and the target source holder defines a predetermined distance D between 5 mm and 200 mm between the cathode 50 and the target source holder to increase efficiency of depositing the target source material on the Nd—Fe—B magnet and provide a uniform coating on the Nd—Fe—B magnet.

The power source 58, 60 includes a pulse bias power supply 58, as generally indicated, having a first positive terminal 62 and a first negative terminal 64. The first positive terminal 62 of the pulse bias power supply 58 is electrically connected to the anode 48. The first negative terminal 64 of the pulse bias power supply 58 is electrically connected to the cathode 50 for providing an electric potential between the cathode 50 and the anode 48 to plate the target source material onto the Nd—Fe—B magnet. The power source 58, 60 further includes a DC bias power supply 60, as generally indicated, having a second positive terminal 66 and a second negative terminal 68. The second positive terminal 66 of the DC bias power supply 60 is electrically connected to the anode 48. The second negative terminal 68 of the DC bias power supply 60 is electrically connected to the at least one target source holder 52, 54 for providing an electric potential to the at least one target source holder 52, 54 and the anode 48 to clean and vaporize the target source material. The anode 48 is also electrically connected to the earth ground 70.

Figure 2:
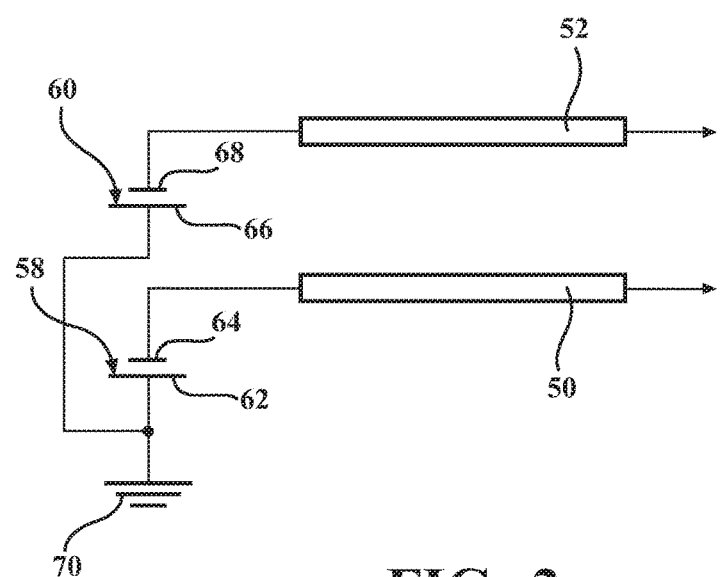
FIG. 2 is a cross-sectional schematic view of the cathode and the target source holder of the apparatus for plating the Nd—Fe—B magnet.
Figure 3:
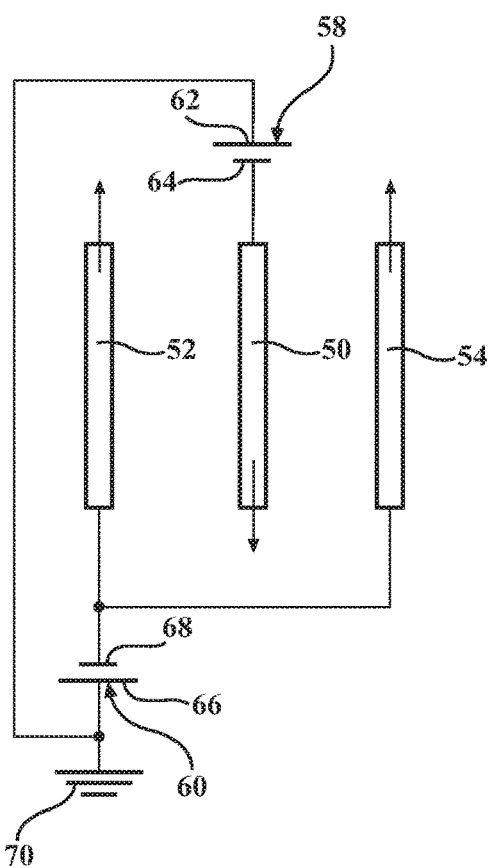
FIG. 3 is a cross-sectional schematic view of an alternative embodiment of the cathode and the target source holder including a first target source holder and a second target source holder of the apparatus for plating the Nd—Fe—B magnet.

As shown in FIGS. 1 and 2, in one embodiment of the present invention, the cathode 50, the anode 48, and the target source holder are disposed in the vacuum chamber 36 in a parallel relationship with the bottom wall 32. In other words, in the one embodiment of the present invention, the cathode 50, the anode 48, and the target source holder all extends transversely between the rear wall 22 of the furnace 20 and the door 42 of the furnace 20 in the vacuum chamber 36. Alternatively, as shown in FIG. 3, the at least one target source holder 52, 54 includes a first target source holder 52 and a second target source holder 54. The first target source holder 52 and the second source holder are disposed in the vacuum chamber 36 sandwiching the cathode 50 between the first target source holder 52 and the second target source holder 54. In other words, the cathode 50 is disposed between the first target source holder 52 and the second target source holder 54 with the first target source holder 52 and the second target source holder 54 being disposed in a parallel and spaced relationship with said cathode 50. In addition, the cathode 50, the anode 48, and the at least one target source holder 52, 54 are disposed in the vacuum chamber 36 in a perpendicular relationship with the bottom wall 32 of the furnace 20.

Figure 4:
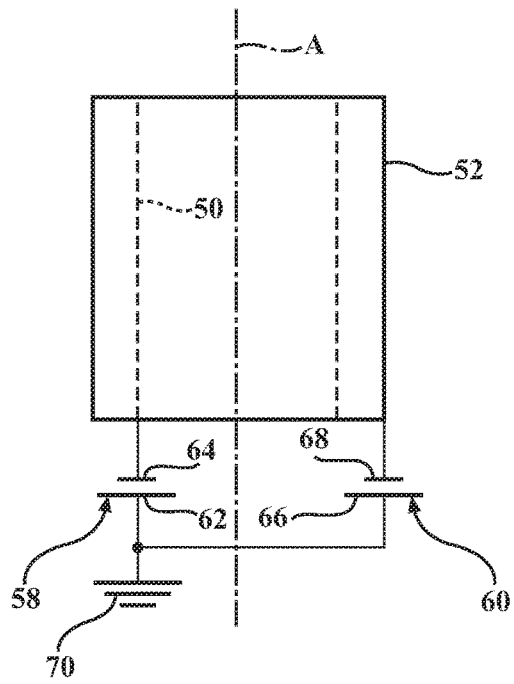
FIG. 4 is a cross-section schematic view of an alternative embodiment of the cathode and the target source holder including a roller of the apparatus for plating the Nd—Fe—B magnet.

In another alternative embodiment of the present invention, as shown in FIG. 4, the apparatus further includes a roller 72 of permeable material and having a cylindrical shape. The roller 72 is disposed in said vacuum chamber 36 and rotatably attached to said furnace 20. It should be appreciated that the roller 72 may be rotatably mounted to a shaft extending through the rear wall 22 of the furnace 20. The roller 72 has an interior surface extending annularly about a center axis A to define a compartment 74 for coating the Nd—Fe—B magnet. The cathode 50 is disposed in the compartment 74 of the roller 72 and the at least one target source holder 52, 54 is disposed adjacent to the roller 72 in the vacuum chamber 36 of the furnace 20.

It is another aspect of the present invention to provide a method of plating an Nd—Fe—B magnet including grease. The method uses a furnace 20 defining a vacuum chamber 36. An anode 48, a cathode 50, and at least one target source holder 52, 54 are disposed in the vacuum chamber 36 with the at least one target source holder 52, 54 being disposed between the cathode 50 and the anode 48. A power source 58, 60 is electrically connected to the anode 48, the cathode 50, and the at least one target source holder 52, 54.

The method includes the first step of removing grease from an Nd—Fe—B magnet to produce a purified Nd—Fe—B magnet. The step of removing the grease further includes a step of rinsing the Nd—Fe—B magnet using a solution of acid and a step of drying the Nd—Fe—B magnet after the step of rinsing to produce the purified Nd—Fe—B magnet. The next step of the method includes disposing a target source material of metal on at least one target source holder 52, 54. In addition, the purified Nd—Fe—B magnet is also disposed on a cathode 50 in a vacuum chamber 36 of a furnace 20 opposite of the at least one target source holder 52, 54.

The next step of the method includes removing air from the vacuum chamber 36 of the furnace 20 to reduce pressure in the vacuum chamber 36 to a first pressure range of between $3.0 \times 10^{-3}$ Pa and $9.0 \times 10^{-3}$ Pa. It should be appreciated that the air may be removed from the vacuum chamber 36 of the furnace 20 through an outlet aperture 38 of a rear wall 22. After removing the air, an inert gas of Argon is fed into the vacuum chamber 36 of the furnace 20 to increase pressure in the vacuum chamber 36 to a final pressure range of between 10 Pa and 100 Pa. It should be appreciated that the inert gas of argon may be fed into the vacuum chamber 36 through an inlet aperture 40 of a bottom wall 32.

Then, the target source material of metal is deposited on the purified Nd—Fe—B magnet to produce a coated Nd—Fe—B magnet. The target source material may be selected from at least one of Dysprosium, Terbium, Holmium, Praseodymium, Neodymium, Niobium, Molybdenum, Copper, Titanium, Aluminum, and Cobalt. The step of depositing the target source material of metal further includes a step of supplying a first electric potential to the cathode 50 to clean the surface of the purified Nd—Fe—B magnet on the cathode 50 using a glow discharge cleaning process. It should be appreciated that the first electric potential can be applied using a pulse bias power supply 58 can be used to apply the first electric potential. After applying the first electric potential, the first electric potential is reduced to zero. The step of depositing the target source material of metal further includes a step of supplying a second electric potential to the at least one target source holder 52, 54 to clean the target source material on the at least one target source holder 52, 54 using a glow discharge cleaning process. It should be appreciated that the second electric potential can be applied by using a DC bias power supply 60. After applying the second electric potential, the second electric potential to zero. The next step of the method includes increasing the first electric potential supplied to the cathode 50 and the second electric potential supplied to the at least one target source holder 52, 54. Next, in response to the surface of the cleaned Nd—Fe—B magnet reaching a predetermined temperature, the first electric potential supplied to the cathode 50 and the second electric potential supplied to the at least one target source holder 52, 54 are terminated to produce a coated Nd—Fe—B magnet.

After terminating the first electric potential and the second electric potential, the predetermined temperature in the vacuum chamber 36 of the furnace 20 is maintained. Next, the coated Nd—Fe—B magnet is cooled in the vacuum chamber 36 of the furnace 20. After cooling the coated Nd—Fe—B magnet, the coated Nd—Fe—B magnet is removed from the vacuum chamber 36 of the furnace 20 and the thickness of the target source deposited on the purified Nd—Fe—B magnet can be determined.

The step of depositing further includes a step of maintaining the predetermined distance D of between 5 mm and 200 mm between opposing surfaces of the cleaned Nd—Fe—B magnet on the cathode 50 and the target source material on the at least one target source holder 52, 54 to increase efficiency of the step of depositing the target source material of metal on the purified Nd—Fe—B magnet. The step of increasing the first electric potential supplied to the cathode 50 and the second electric potential supplied to the at least one target source holder 52, 54 is further defined as increasing the first electric potential supplied to the cathode 50 and the second electric potential supplied to the at least one target source holder 52, 54 with the second electric potential being greater than the first electric potential. Additionally, the step increasing the first electric potential supplied to the cathode 50 and the second electric potential supplied to the at least one target source holder 52, 54 further includes a step of maintaining a potential differential range of between 0V and 500V between the cathode 50 and the at least one target source holder 52, 54.

Obviously, many modifications and variations of the present invention are possible in light of the above teachings and may be practiced otherwise than as specifically described while within the scope of the appended claims. These antecedent recitations should be interpreted to cover any combination in which the inventive novelty exercises its utility. The use of the word "said" in the apparatus claims refers to an antecedent that is a positive recitation meant to be included in the coverage of the claims whereas the word "the" precedes a word not meant to be included in the coverage of the claims. In addition, the reference numerals in the claims are merely for convenience and are not to be read in any way as limiting.

What is claimed is:

1. An apparatus for plating an Nd—Fe—B magnet using a target source material, said apparatus comprising:
   a furnace defining a vacuum chamber;
   an anode being elongated disposed in said vacuum chamber of said furnace;
   a cathode being elongated and disposed in said vacuum chamber of said furnace spaced from said anode and configured with the Nd—Fe—B magnet;
   at least one target source holder being elongated and disposed in said vacuum chamber and supporting said anode and said cathode, said anode and said cathode and said at least one target source being disposed in a parallel and spaced relationship with one another, the cathode configured for receiving the target source material to coat the Nd—Fe—B magnet, wherein said target source material contains metal and is selected from at least one of Dysprosium, Terbium, Holmium, Praseodymium, Neodymium, Niobium, Molybdenum, Copper, Titanium, Aluminum, and Cobalt;

a thermal insulator disposed in said vacuum chamber surrounding said cathode and said at least one target source wherein said anode is located outside of said thermal insulator;

a pulse bias power supply electrically connected to said cathode and said anode for cleaning and vaporizing the target source material to plate the target source material onto the Nd—Fe—B magnet;

a DC bias power supply electrically connected to said at least one target source holder and said anode with said anode being grounded;

said furnace defining an outlet aperture in fluid communication with said vacuum chamber for withdrawing air from said vacuum chamber to reduce pressure in said vacuum pressure and an inlet aperture in fluid communication with said vacuum chamber for feeding an inert gas to said vacuum chamber;

said furnace defining an observation window for allowing a user to look into the vacuum chamber; and an optical pyrometer disposed adjacent to said observation window and facing toward said observation window and said vacuum chamber for monitoring a temperature in said vacuum chamber;

said cathode and said at least one target source holder defining a predetermined distance between 5 mm and 200 mm between said cathode and said target source holder to increase efficiency of depositing the target source material on the Nd—Fe—B magnet and provide a uniform coating on the Nd—Fe—B magnet.

2. The apparatus as set forth in claim 1 wherein said pulse bias power supply having a first positive terminal and a first negative terminal with said first positive terminal being electrically connected to said anode and said first negative terminal being electrically connected to said cathode for providing an electric potential between said cathode and said anode to plate the target source material onto the Nd—Fe—B magnet.

3. The apparatus as set forth in claim 2 wherein said DC bias power supply having a second positive terminal and a second negative terminal with said second positive terminal being electrically connected to said anode and said second negative terminal being electrically connected to said at least one target source holder for providing an electric potential to said at least one target source holder and said anode to clean and vaporize the target source material.

4. The apparatus as set forth in claim 3 wherein said anode being electrically connected to the earth ground.

5. The apparatus as set forth in claim 1 wherein said at least one target source holder includes a first target source holder and a second target source holder disposed in said vacuum chamber sandwiching said cathode between said first target source holder and said second target source holder and in a parallel and spaced relationship with said cathode.

6. The apparatus as set forth in claim 1 further includes a roller of permeable material and having a cylindrical shape disposed in said vacuum chamber and rotatably attached to said furnace and having an interior surface extending annularly about a center axis to define a compartment for coating the Nd—Fe—B magnet.

7. The apparatus as set forth in claim 6 wherein said cathode is disposed in said compartment of said roller and said at least one target source holder is disposed adjacent to said roller in said vacuum chamber of said furnace.

* * * * *